(12) United States Patent
Kane

(10) Patent No.: US 7,754,668 B2
(45) Date of Patent: Jul. 13, 2010

(54) COMPOSITIONS FOR THE REMOVAL OF POST-ETCH AND ASHED PHOTORESIST RESIDUES AND BULK PHOTORESIST

(75) Inventor: Sean M. Kane, Bethlehem, PA (US)

(73) Assignee: Mallinckrodt Baker. Inc, Phillipsburg, NJ (US)

( * ) Notice: Subject to any disclaimer, the term of this patent is extended or adjusted under 35 U.S.C. 154(b) by 218 days.

(21) Appl. No.: 11/911,346

(22) PCT Filed: Apr. 18, 2006

(86) PCT No.: PCT/US2006/014466

§ 371 (c)(1),
(2), (4) Date: Oct. 12, 2007

(87) PCT Pub. No.: WO2006/121580

PCT Pub. Date: Nov. 16, 2006

(65) Prior Publication Data

US 2008/0261846 A1  Oct. 23, 2008

(51) Int. Cl.
C11D 7/50 (2006.01)
(52) U.S. Cl. .................................. 510/175; 134/1.3
(58) Field of Classification Search ................. 510/175; 134/1.3
See application file for complete search history.

(56) References Cited

U.S. PATENT DOCUMENTS

| | | | |
|---|---|---|---|
| 3,138,557 A | | 6/1964 | Arden et al. |
| 5,972,862 A | | 10/1999 | Torii et al. |
| 6,323,169 B1 | * | 11/2001 | Abe et al. .................. 510/176 |
| 6,486,108 B1 | | 11/2002 | Yates et al. |
| 6,514,921 B1 | | 2/2003 | Kakizawa et al. |
| 6,783,695 B1 | | 8/2004 | Torek et al. |
| 6,815,150 B2 | * | 11/2004 | Nakahara et al. ........... 430/323 |
| 2002/0066465 A1 | * | 6/2002 | Gotoh et al. ................ 134/2 |
| 2002/0165105 A1 | | 11/2002 | Yates et al. |
| 2002/0165106 A1 | | 11/2002 | Yates et al. |
| 2002/0165107 A1 | | 11/2002 | Yates et al. |
| 2002/0169089 A1 | | 11/2002 | Yates et al. |
| 2002/0187906 A1 | | 12/2002 | Yates et al. |
| 2003/0130149 A1 | | 7/2003 | Zhou et al. |
| 2003/0152874 A1 | | 8/2003 | Nakahara et al. |
| 2004/0137736 A1 | | 7/2004 | Daviot et al. |
| 2004/0149309 A1 | | 8/2004 | Hsu |

FOREIGN PATENT DOCUMENTS

| | | |
|---|---|---|
| EP | 0 827 188 | 3/1998 |
| EP | 1 035 446 | 9/2000 |

* cited by examiner

*Primary Examiner*—Gregory E Webb
(74) *Attorney, Agent, or Firm*—George W. Rauchfuss, Jr. Esq.; Ohlandt, Greeley, Ruggiero & Perle LLP.

(57) ABSTRACT

The invention provides cleaning compositions for cleaning microelectronic substrates that are able to essentially completely clean such substrates and inhibit metal corrosion or produce essentially no corrosion of the metal elements of such substrates, and to do so at relatively short cleaning times and relatively low temperatures compared to the cleaning times required for prior art alkaline-containing cleaning compositions. The invention also provides method of using such cleaning compositions to clean microelectronic substrates without producing any significant corrosion of the metal elements of the microelectronic substrate. The cleaning compositions of this invention comprise (a) at least one organic solvent, (b) at least one unneutralized inorganic phosphorus-containing acid, and (c) water. The cleaning compositions of this invention optionally can have present in the compositions other components, such as for example surfactants, metal complexing or chelating agents, corrosion inhibitors, and the like. The cleaning compositions of this invention are characterized by an absence of organic amines, hydroxylamines or other strong bases such as ammonium bases and the like that would neutralize the inorganic phosphorus-containing acid component. The cleaning and residue removal compositions of this invention are especially suitable for cleaning microelectronic substrates containing aluminum, titanium, and tungsten.

12 Claims, No Drawings ns, and the like. Other suitable solvents include sulfoxides, such as for example dimethyl sulfoxide, sulfones, such as for example dimethyl sulfone, diethyl sulfone, bis(2-hydroxyethyl) sulfone, and tetramethylene sulfone.

COMPOSITIONS FOR THE REMOVAL OF POST-ETCH AND ASHED PHOTORESIST RESIDUES AND BULK PHOTORESIST

FIELD OF THE INVENTION

This invention relates to methods and post-etch and/or photoresist ash residue cleaning compositions for cleaning microelectronics substrates, particularly aluminum or titanium containing microelectronic components. The compositions of this invention provide enhanced protection of metal, i.e., inhibition of corrosion, when such microelectronic substrates are subjected to cleaning and a subsequent aqueous rinse.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a substrate material, and then circuit design is imaged on the thin film. Following baking, the exposed resist is removed with a photoresist developer. The resulting image is then transferred to the underlying material, which is generally a dielectric or metal, by way of plasma etch gases or chemical etchant solutions. The etchant gases or chemical etchant solutions selectively attack the photoresist-unprotected area of the substrate. As a result of the plasma etching process, photoresist and etched material by-products are deposited as residues around or on the sidewall of the etched openings (vias) on the substrate and the photoresist.

Additionally, following the termination of the etching step, the resist mask must be removed from the protected area of the substrate so that the next process operation can take place. This can be accomplished in a plasma ashing step by the use of suitable plasma ashing gases or wet chemical strippers. Finding a suitable cleaning composition for removal of this resist mask material without adversely affecting, e.g., corroding, etching or dulling, the metal circuitry has also proven problematic.

As microelectronic fabrication integration levels have increased and patterned microelectronic device dimensions have decreased, it has become increasingly difficult to provide suitable photoresist stripping and cleaning compositions that provide suitable stripping and cleaning properties without producing other detrimental effects. In the area of semiconductors and flat panel displays (FPD), the problem of metal corrosion during photoresist stripping, residue removal and the water rinse is a severe drawback, particularly with the use of select metals such as aluminum, titanium, and tungsten and alloys.

A typical residue remover for microelectronic applications might be an alkaline-containing composition that includes polar organic solvents blended with organic amines or hydroxylamines or other strong bases typically in polar organic solvents and other solvating agents in an attempt to lessen metal and dielectric attack or corrosion. Amines, hydroxylamines and other strong bases have been shown to increase the effectiveness of photoresist and residue removal in solvent blends. However, such alkaline ash residue removal formulations experience carbon dioxide uptake from the air, which in most cases shortens the cleaner solution's effective bath life. Moreover, these alkaline cleaner compositions are relatively slow acting and require the substrates to be kept in the cleaner solutions for extended times at elevated temperatures. Moreover, the water rinse following this type of remover can create a strongly alkaline aqueous solution and that can lead to considerable loss of metal from the patterned lines, particularly aluminum which is very sensitive to corrosion in alkaline aqueous solution. This necessitates an intermediate rinse between the cleaning/stripping step and the aqueous rinse. Such an intermediate rinse, typically with isopropyl alcohol, adds undesirable time, safety concerns, environmental consequences, and cost to the manufacturing process.

There is, therefore, a need for stripping and cleaning compositions for photoresists and residues that enable one to completely remove etch and/or ash residue, as well as bulk photoresist, from the microelectronic substrate, especially a need for such cleaner and residue removing compositions that do not produce any significant metal corrosion.

SUMMARY OF THE INVENTION

The invention provides cleaning compositions for cleaning microelectronic substrates that are able to essentially completely clean such substrates and inhibit metal corrosion or produce essentially no corrosion of the metal elements of such substrates, and to do so at relatively short cleaning times and relatively low temperatures compared to the cleaning times required for prior art alkaline-containing cleaning compositions. The invention also provides method of using such cleaning compositions to clean microelectronic substrates without producing any significant corrosion of the metal elements of the microelectronic substrate. The cleaning compositions of this invention comprise (a) at least one water-soluble or water-miscible organic solvent, (b) at least one unneutralized inorganic phosphorus-containing acid, and (c) water. The cleaning compositions of this invention optionally can have present in the compositions other components, such as for example surfactants, metal complexing or chelating agents, corrosion inhibitors, and the like. The cleaning compositions of this invention are characterized by an absence of organic amines, hydroxylamines or other strong bases such as ammonium bases and the like that would neutralize the inorganic phosphorus-containing acid component. The cleaning and residue removal compositions of this invention are especially suitable for cleaning microelectronic substrates containing aluminum, titanium, and tungsten.

DETAILED DESCRIPTION OF THE INVENTION AND PREFERRED EMBODIMENTS

The invention provides cleaning compositions for cleaning microelectronic substrates that are able to essentially completely clean such substrates and inhibit metal corrosion or produce essentially no corrosion of the metal elements of such substrates. The invention also provides method of using such cleaning compositions to clean microelectronic substrates without producing any significant corrosion of the metal elements of the microelectronic substrate. The cleaning compositions of this invention comprise (a) at least one organic solvent, (b) at least one unneutralized inorganic phosphorus-containing acid, and (c) water.

The cleaning compositions of this invention contain one or more suitable water-soluble or water miscible organic solvents. Among the various organic solvents suitable are alcohols, polyhydroxy alcohols, such as for example, glycerol, glycols, such as for example propylene glycol and diethylene glycol, glycol ethers, such as for example 2-(2-ethoxyethoxy) ethanol (carbitol), alkyl-pyrrolidinones, such as for example N-methylpyrrolidinone (NMP), 1-hydroxyalkyl-2-pyrrolidinones such as for example, 1-(2-hydroxyethyl)-2-pyrrolidinone (HEP), dimethylformamide (DMF), dimethylacetamide (DMAC), sulfones, such as for example sulfolane, and sulfoxides, such as for example, dimethylsulfoxide (DMSO). The organic solvents are preferably polar organic solvents. Preferred water-soluble organic solvents are diethylene glycol, propylene glycol, N-methylpyrrolidinone, sulfolane, DMSO and dimethylacetamide. The cleaning compositions of this invention contains one or more organic solvent generally in an amount of from about 35% to about 95%, preferably from about 60% to about 90%, more preferably from about 75% to about 85%, by weight of the composition.

The cleaning compositions of this invention contain one or more unneutralized inorganic-phosphorus-containing acid. Any suitable unneutralized inorganic phosphorus-containing acid may be employed in the cleaning compositions of this invention. Examples of such unneutralized inorganic-phosphorus-containing acid include, but are not limited to, phosphorous ($H_3PO_3$), hypophosphorous ($H_3PO_2$) and phosphoric acids ($H_3PO_4$). The unneutralized inorganic-phosphorus-containing acid component of the cleaning composition will be present in the cleaning composition in an amount such that the weight ratio of the organic solvent component to the unneutralized inorganic-phosphorus-containing acid component is from about 3:1 to about 40:1, preferably from about 3:1 to about 20:1 and more preferably from about 4:1 to about 10:1

The water component of the cleaning composition of this invention may be present in an amount of from about 3% to about 60%, preferably from about 5% to about 50%, and more preferably from about 5% to about 10%, by weight of the composition. In general, the water component will be added to the cleaning composition as part of the unneutralized inorganic phosphorus-containing acid component since such acids are normally available as water-containing solutions. The water may however be added as a separate component apart from or in addition to the acid component.

The compositions of the present invention may also contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired. Further, surfactant properties may aid the dispersion of particulates, facilitating better cleaning. Any suitable amphoteric, cationic or non-ionic surfactant may be employed in the compositions of this invention. Examples of especially suitable surfactants include, but are not limited to 3,5-dimethyl-1-hexyn-3-ol (Surfynol-61), ethoxylated 2,4,7,9-tetramethyl-5-decyne-4,7-diol (Surfynol-465), polytetrafluoroethylene cetoxypropylbetaine (Zonyl FSK), Zonyl FSH, Triton X-100, namely octylphenoxypolyethoxyethanol, and the like. The surfactant will generally be present in an amount of from 0 to about 5 wt %, preferably 0.001 to about 3 wt % based on the weight of the composition.

The cleaning compositions of this invention can also optionally contain other components, including but not limited to, corrosion inhibitors and similar non-corrosive components employed in microelectronic cleaning compositions. The compounds may include catechol, resorcinol, gallic acid, propyl gallate, pyrogallol, hydroquinone, derivatives of benzotriazole, and polyfunctional carboxylic acids such as citric acid, tartaric acid, gluconic acid, saccharic acid, glyceric acid, oxalic acid, phthalic acid, maleic acid, mandelic acid, malonic acid, lactic acid, and salicylic acid.

Organic or inorganic chelating or metal complexing agents are not required, but may offer substantial benefits, such as for example, improved product stability, cleaning, and corrosion prevention when incorporated into the cleaning compositions of this invention. Examples of suitable chelating or complexing agents include but are not limited to trans-1,2-cyclohexanediamine tetraacetic acid (CyDTA), ethylenediamine tetraacetic acid (EDTA), pyrophosphates, alkylidenediphosphonic acid derivatives (e.g. 1-hydroxyethane-1,1-diphosphonate (HEDPA)). The chelating agent will be present in the composition in an amount of from 0 to about 5 wt %, preferably from about 0.1 to about 2 wt % based on the weight of the composition.

In one preferred embodiment of the invention the cleaning composition comprises hypophosphorous acid and water along with one or more of N-methylpyrrolidinone, sulfolane, diethylene glycol, and DMSO. In another preferred embodiment the cleaning composition comprises phosphorous acid and water along with one or more of N-methylpyrrolidinone, sulfolane, diethylene glycol, and DMSO.

In another aspect of the invention the invention comprises a method of cleaning a microelectronic substrate, the substrate containing photoresist polymeric material, residues, such as ashing or etching residues, and metal containing layers, the method comprising contacting the substrate with a cleaning composition for a time sufficient to clean the substrate, wherein the cleaning composition comprises the following components:

a. at least one water-soluble or water-miscible organic solvent, b. at least one unneutralized inorganic phosphorus-containing acid, and c. water, wherein the composition is free of organic amines, hydroxylamines and strong bases that would neutralize the inorganic phosphorus-containing acid component. The method is especially suitable for cleaning microelectronic substrates containing multiple metal layers and particularly substrates characterized by the presence of aluminum, titanium and tungsten metals.

The compositions of this invention, their use to clean microelectronic substrates and their non-metal corroding properties is illustrated by, but not limited to, the following examples.

In the following Examples and Tables the following abbreviation are employed.

NMP=N-methylpyrrolidinone
DEG=Diethylene glycol
DMSO-dimethysulfoxide
PG=propylene glycol
DMAC=dimethylacetamide
HPA=hypophosphorous acid
PA=phosphorous acid
HEDPA=1-hydroxyethane-1,1-diphosphonic acid Example 1-7

Compositions of this invention were tested for their ability to clean microelectronic devices by immersing in the compositions of this invention substrates having Al/TiN (aluminum/titanium nitride) layers that had been coated with photoresist, exposed, developed, hard etched and ashed to produce titanium rich vias that are generally very difficult to clean at low temperatures. The sample substrates were immersed in the cleaning compositions at 45° C. for 10 minutes, followed by a 1 min. DI water rinse. The results in Table 1 demonstrate the cleaning and relatively non-corrosive nature of the composition of this invention.

TABLE 1

| Composition | Solvent | % | Acid | % | % Water | % Clean | % Etch |
|---|---|---|---|---|---|---|---|
| 1 | NMP | 83.3 | HPA | 8.3 | 8.3 | 90 | 5 |
| 2 | NMP | 83.3 | PA | 8.3 | 8.3 | 70 | 20 |
| 3 | DMSO | 83.3 | HPA | 8.3 | 8.3 | 70 | 20 |
| 4 | Sulfolane | 83.3 | HPA | 8.3 | 8.3 | 70 | 20 |
| 5 | Sulfolane | 40 | HPA | 10 | 50 | 80 | 10 |
| 6 | DEG | 83.3 | HPA | 8.3 | 8.3 | 90 | 5 |
| 7 | DEG | 90 | HPA | 4.5 | 4.5 | 70 | 10 |

Examples 8-17

Compositions of this invention were tested for their ability to clean microelectronic devices by immersing in the compositions of this invention substrates having Al/TiN layers that had been coated with photoresist, exposed, developed, hard etched and ashed to produce metal lines that are generally more easy to clean than the vias in Examples 1-7. The sample substrates were immersed in the compositions at 65° C. for 20 minutes, followed by a 1 min. Di water rinse. The results in Table 2 demonstrate the cleaning and relatively non-corrosive nature of the composition of this invention, particularly in the presence of select additives.

TABLE 2

| Composition | Solvent | % | % HPA | % Water | % HEDPA | Clean | Etch |
|---|---|---|---|---|---|---|---|
| 8 | DMSO | 77 | 3.8 | 10 | 9.2 | 100% | 0% |
| 9 | DMSO | 83 | 4.2 | 7.8 | 5 | 100% | 10% |
| 10 | NMP | 86 | 2.2 | 6.6 | 5.2 | 90% | 0% |
| 11 | NMP | 77 | 3.8 | 10 | 9.2 | 100% | 10% |
| 12 | NMP | 86 | 4.3 | 7.1 | 2.6 | 100% | 50% |
| 13 | NMP | 83 | 4.2 | 7.8 | 5 | 100% | 20% |
| 14 | PG | 83 | 4.2 | 7.8 | 5 | 100% | 20% |
| 15 | DMAC | 71.4 | 7.1 | 13 | 8.5 | 100% | 20% |
| 16 | DMAC | 90.1 | 2.3 | 4.9 | 2.7 | 70% | 20% |
| 17 | DMSO | 77 | 3.8(PA) | 10 | 9.2 | 100% | 0% |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A composition for cleaning microelectronic substrates consisting essentially of the following components:
   (a) at last one water-soluble or water-miscible organic solvent,
   (b) at least one unneutralized inorganic phosphorus-containing acid, and
   (c) water,
   and optionally
   (d) at least one surfactant,
   (e) at least one corrosion inhibitor, and
   (f) at least one metal chelating or complexing agent;
   wherein the composition is free of organic amines, hydroxylamines and strong bases that would neutralize the inorganic phosphorus-containing acid component and wherein the water-miscible organic solvent consists essentially of from about 35% to about 95% by weight of the composition and the weight ratio of the organic solvent component to the unneutralized inorganic phosphorus-containing acid component is in the range of from about 3:1 to about 40:1 and the water is present in the composition in an amount of from about 5% to about 10% based on the weight of the composition.

2. A composition according to claim 1 wherein the unneutralized inorganic phosphorus-containing acid comprises an acid selected from the group consisting of phosphorous ($H_3PO_3$), hypophosphorous ($H_3PO_2$) and phosphoric acids ($H_3PO_4$).

3. A composition according to claim 2 wherein the water-soluble or water miscible organic solvent component is selected from the group consisting of N-methylpyrrolidinone, sulfolane, dimethylsulfoxide, diethylene glycol, propylene glycol, and dimethylacetamide.

4. A composition according to claim 2 wherein the unneutralized inorganic phosphorus-containing acid comprises phosphorous acid ($H_3PO_3$).

5. A composition according to claim 3 wherein the unneutralized inorganic phosphorus-containing acid comprises hypophosphorous acid ($H_3PO_2$).

6. A composition according to claim 1 wherein 1-hydroxyethane-1,1,-diphosphonic acid is present as a corrosion inhibitor.

7. A method of cleaning a microelectronic substrate, the substrate containing photoresist polymeric material, residues and a metal, the process comprising contacting the substrate with a cleaning composition for a time sufficient to clean the substrate, wherein the cleaning composition consisting essentially of the following components:
   (a) at last one water-soluble or water-miscible organic solvent,
   (b) at least one unneutralized inorganic phosphorus-containing acid, and
   (c) water,
   and optionally
   (d) at least one surfactant,
   (e) at least one corrosion inhibitor, and
   (f) at least one metal chelating or complexing agent;
   wherein the composition is free of organic amines, hydroxylamines and strong bases that would neutralize the inorganic phosphorus-containing acid component and wherein the water-miscible organic solvent consists essentially of from about 35% to about 95% by weight of the composition and the weight ratio of the organic solvent component to the unneutralized inorganic phosphorus-containing acid component is in the range of from about 3:1 to about 40:1 and the water is present in the composition in an amount of from about 5% to about 10% based on the weight of the composition.

8. A method according to claim 7 wherein the unneutralized inorganic phosphorus-containing acid comprises an acid selected from the group consisting of phosphorous ($H_3PO_3$), hypophosphorous ($H_3PO_2$) and phosphoric acids ($H_3PO_4$).

9. A method according to claim 8 wherein the water-soluble or water miscible organic solvent component is selected from the group consisting of N-methylpyrrolidinone, sulfolane, dimethylsulfoxide, diethylene glycol, propylene glycol, and dimethylacetamide.

10. A method according to claim 8 wherein the unneutralized inorganic phosphorus-containing acid comprises phosphorous acid ($H_3PO_3$).

11. A method according to claim 9 wherein the unneutralized inorganic phosphorus-containing acid comprises hypophosphorous acid ($H_3PO_2$).

12. A method according to claim 7 wherein 1-hydroxyethane-1,1,-diphosphonic acid is present as a corrosion inhibitor.

* * * * *